United States Patent

Egger et al.

[11] Patent Number: 6,119,926
[45] Date of Patent: Sep. 19, 2000

[54] METHOD FOR PRODUCING WIRE CONNECTIONS ON SEMICONDUCTOR CHIPS

[75] Inventors: Hans Egger, Sins; Marit Seidel, Unterägeri; Daniel von Flüe, Cham, all of Switzerland

[73] Assignee: Esec SA, Cham, Switzerland

[21] Appl. No.: 09/247,325

[22] Filed: Feb. 10, 1999

[30] Foreign Application Priority Data

Feb. 19, 1998 [CH] Switzerland .............................. 392/98

[51] Int. Cl.[7] .......................... B23K 31/00; B23K 31/02
[52] U.S. Cl. ....................................................... 228/180.5
[58] Field of Search ........................................ 228/180.5

[56] References Cited

U.S. PATENT DOCUMENTS

| | | | |
|---|---|---|---|
| 4,080,009 | 3/1978 | Marathe et al. | 308/3.5 |
| 4,327,860 | 5/1982 | Kirshenboin et al. | 228/179 |
| 4,597,522 | 7/1986 | Kobayashi | 228/179 |
| 4,730,945 | 3/1988 | Luther et al. | 384/45 |
| 4,819,326 | 4/1989 | Stannek | 29/837 |
| 4,932,584 | 6/1990 | Yamazaki et al. | 228/179 |
| 4,934,891 | 6/1990 | Hawkswell | 414/223 |
| 4,937,511 | 6/1990 | Herndon et al. | 318/568.21 |
| 4,976,392 | 12/1990 | Smith et al. | 228/102 |
| 5,023,544 | 6/1991 | Vallone et al. | 324/158 F |
| 5,024,720 | 6/1991 | Boss et al. | 156/584 |
| 5,086,559 | 2/1992 | Akatsuchi | 29/864 |
| 5,111,989 | 5/1992 | Holdgrafer et al. | 228/110 |
| 5,148,964 | 9/1992 | Shimizu | 228/102 |
| 5,152,858 | 10/1992 | Winter | 156/157 |
| 5,156,323 | 10/1992 | Kumazawa et al. | 228/179 |
| 5,157,617 | 10/1992 | Ramsey | 364/478 |
| 5,158,223 | 10/1992 | Shimizu | 228/1.1 |
| 5,192,018 | 3/1993 | Terakado et al. | 228/179 |
| 5,205,463 | 4/1993 | Holdgrafer et al. | 228/102 |
| 5,259,548 | 11/1993 | Yamazaki et al. | 228/180.5 |
| 5,339,939 | 8/1994 | Gueble et al. | 198/345.2 |
| 5,342,460 | 8/1994 | Hidese | 156/64 |
| 5,380,099 | 1/1995 | Teramachi | 384/45 |
| 5,452,841 | 9/1995 | Sibata et al. | 228/180.5 |
| 5,455,409 | 10/1995 | Smith et al. | 235/385 |
| 5,459,794 | 10/1995 | Ninomiya et al. | 382/145 |
| 5,488,771 | 2/1996 | Devitt et al. | 29/898.02 |
| 5,553,376 | 9/1996 | Solanki et al. | 29/833 |
| 5,562,384 | 10/1996 | Alvite et al. | 414/222 |
| 5,564,188 | 10/1996 | Akasako et al. | 29/898.03 |
| 5,586,713 | 12/1996 | Arita et al. | 228/102 |
| 5,591,920 | 1/1997 | Price et al. | 73/828 |
| 5,694,443 | 12/1997 | Stone et al. | 377/6 |
| 5,713,125 | 2/1998 | Watanabe et al. | 29/833 |
| 5,768,759 | 6/1998 | Hudson | 29/407.04 |
| 5,838,574 | 11/1998 | Olson et al. | 364/478.07 |
| 5,838,754 | 11/1998 | Olson et al. | 364/478.07 |
| 5,885,052 | 3/1999 | Tsuji et al. | 414/744.6 |
| 5,941,674 | 8/1999 | Briehl | 414/417 |
| 5,967,401 | 10/1999 | Nishiura et al. | 228/180.5 |

FOREIGN PATENT DOCUMENTS 4-033346 2/1992 Japan .......................... H01L 21/60

*Primary Examiner*—Patrick Ryan
*Assistant Examiner*—Zidia Pittman
*Attorney, Agent, or Firm*—D'Alessandro & Ritchie

[57] ABSTRACT

On the production of wire connections (wire bonding) which start from a semiconductor chip and end on a substrate (2b) the capillary (12) guiding the wire (3) should be moved to an end section (s3) of its trajectory in a specific, programmed way in order to eliminate as far as possible reactions on the geometry of the wire bridge on bonding of the wire to the substrate and to produce flawless bond connections. The end section (s3) in which the capillary (12) moves slowly begins at a predetermined height (H) and ends on the substrate at the second connection point (5). In the end section (s3) the downward movement (vv) of the capillary is superimposed by a horizontal movement (vh) which is directed away from the already existing connection of the wire (3) to the chip and which continually decreases in relationship to the downward movement (vv).

10 Claims, 3 Drawing Sheets

METHOD FOR PRODUCING WIRE CONNECTIONS ON SEMICONDUCTOR CHIPS

PRIORITY CLAIM

The present application claims priority under 35 U.S.C. §119 based upon Swiss application no. 1998 0392/98, filed Feb. 19, 1998.

BACKGROUND OF THE INVENTION

The invention is related to a method for producing wire connections between a first connection point located on a semiconductor chip and a second connection point located on a substrate. By means of such wire connections, the electrical connections to the integrated circuits located on the chip are made during semiconductor assembly. The second connection point of the connection can be typically located on a metallic system carrier, a so-called "lead frame" or on a different system carrier, e.g, a printed circuit with a plastic, ceramic or so-called "ball grid array" substrate, but the second connection point can also be located on a further semiconductor chip as is the case for arrangements having several chips on the same carrier ("multi-chip devices").

In accordance with generally known processes for the production of such wire connections, a wire runs through a capillary which is horizontally and vertically moveable by means of a programmable drive arrangement, which serves not only to attach the wire at both connection points but also for leading the wire between the connection points. After securing the wire to the first connection point, the capillary is always moved by the named drive arrangement to the second connection point along a predetermined trajectory on which the necessary wire length is pulled through and the wire is formed into a bridge (e.g, EP-A 0 792 716).

High demands are set on the geometry or dimensional accuracy and the mechanical stability of such wire bridges; in particular, the height of the wire loop over the surface of the chip and the substrate should generally be defined as accurately as possible and of course no touching of the edges should occur on the chip. Often numerous wire bridges leading from the chip lie close together ("fine pitch"), whereby any contact between neighbouring wires must be avoided.

A critical phase always exists at the end of the capillary movement when the capillary approaches the substrate from above, the height of which generally differs from the chip surface and exhibits some variations. It is necessary to reduce the high vertical speed of the capillary on approach. It is also known to determine the impact of the capillary on the substrate by means of a force sensor in order to completely stop the movement and to initiate the bonding of the wire to the second connection point. However, the wire first runs out under the capillary in a (smaller or larger) loop the lowest point of which touches the substrate first. Consequently, the loop is pressed flat and the wire bent sharply at the capillary and finally on bonding the wire cross-section between capillary and substrate deforms. The danger exists that on "jolting" the named wire loop the preshaped wire bridge between the capillary and the first connection point is deformed inadmissibly or is bent outwards vertically and/or laterally. Meanwhile, the wire can also be partially pushed back into the capillary, i.e, the situation is altogether difficult to master.

It is the object of the present invention to resolve the difficulties mentioned so that in series production wire bridges can be achieved in the required, programmed form with high reproduceability of the shape and with high stability.

BRIEF DESCRIPTION OF THE INVENTION

In accordance with the invention, this object is solved in that in an end phase of the programmed capillary trajectory, which begins at a predetermined height above the second connection point and during which the capillary leads the wire to the substrate, a variable horizontal movement is superimposed on the downward movement of the capillary which horizontal movement is directed away from the first connection point and which horizontal movement continually decreases in relation to the downward movement. This means that during the end phase of the trajectory the wire is unrolled on the substrate.

In this way, sufficiently taut wire bridges are formed with high regularity which are bent out neither laterally nor vertically nor incline to bend outwards. As a further advantage, a favourable influence could be determined on the cross-sectional deformation of the wire at the second connection point and thereby on the mechanical stability of the bond connection to the substrate.

The invention is explained in more detail below based on embodiments in combination with the drawing.

BRIEF DESCRIPTION OF THE DRAWING FIGURES

There is shown, in:

DETAILED DESCRIPTION OF THE INVENTION

Figure 1:
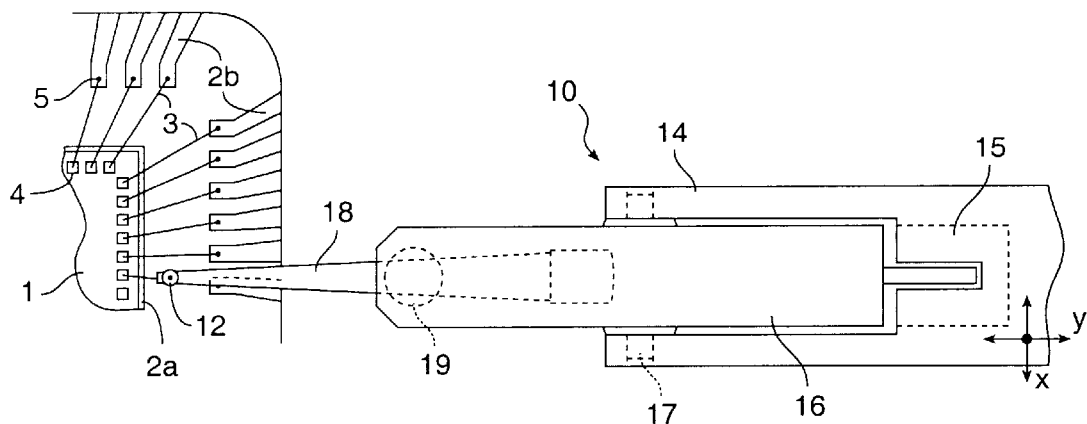
FIG. 1 is the simplified plan view of a generally known arrangement and device for carrying out the process.
Figure 2:
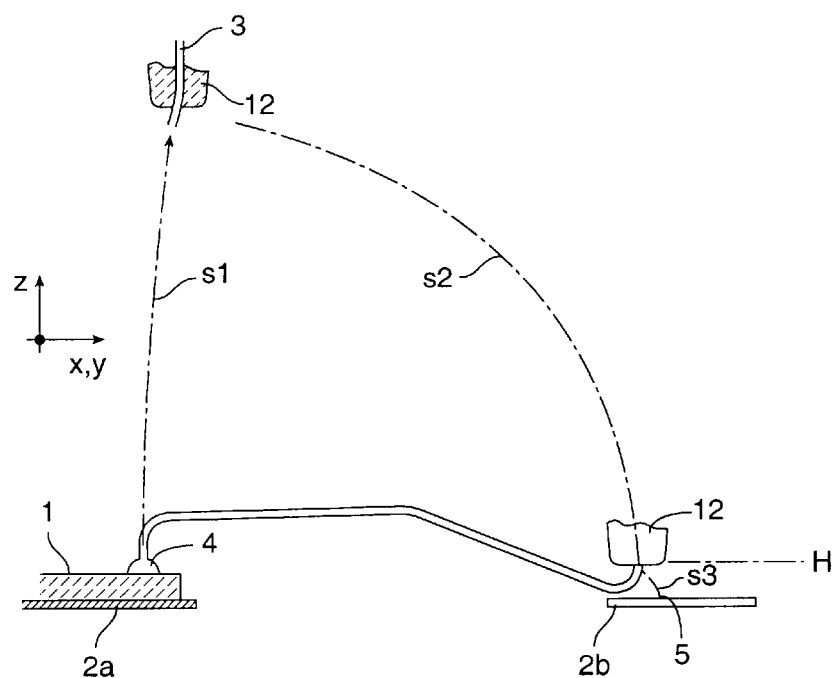
FIG. 2 shows part of the arrangement according to FIG. 1 from the side and greatly enlarged.

FIGS. 1 and 2 schematically illustrate a general arrangement and a device with which the process in accordance with the invention is carried out. As workpiece, a semiconductor chip 1 which is mounted on a system carrier is presented to the left of FIG. 1 as a cut-out. The system carrier, e.g, a so-called leadframe of punched or etched copper plate, fundamentally has the island 2a carrying the chip 1 and contact fingers 2b arranged all around it.

With the process called "wire bonding" , shaped wire connections 3 are produced between first connection points 4 located on the chip surface and second connection points 5 located on the contact fingers 2b. The connections 3 are formed from a fine wire which runs from above through a horizontally and vertically movable capillary 12 (FIG. 2). The capillary 12 serves on the one hand to attach (bond) the wire to the points 4 and 5 and on the other hand to guide the wire between these points.

The capillary 12 is a part of a generally known, microprocessor controlled device 10 which carries out the necessary movement cycles. A slide 14 of the device 10 carries out horizontal movements (x and y directions, FIG. 1) driven in a known way, not presented in detail, e.g, by means of linear motors. In the example presented, the slide 14 carries a rocker 16 which, together with a horn 18 running on it on bearings, can be swivelled on a horizontal axis 17 (vertically aligned linear guides for the horn are also known). A (linear) motor 15 located on the slide 14 serves as swivel drive which effects the vertical movements of the capillary 12 (z direction, FIG. 2). Via the horn 18, the ultrasonic energy necessary for bonding at points 4 and 5 is transmitted to the capillary 12 which is clamped at the end of the horn. The vertical force thereby exerted on the support (chip or substrate) is measured by means of a force sensor 19. Normally, a controllable wire clamp (not presented) is arranged above the capillary 12 with which the pull out of the wire can be stopped or released.

On a specific workpiece, the position of all bond points 4 and 5 is always known and the general form of the wire bridges to be produced 3 (in particular also their height above the chip 1) is specified. The directions of the individual wire bridges (x and y components, FIG. 1) and the necessary wire length result then as basic data for programming the movement cycles. Always starting from a point 4 on the chip 1 to which the wire is first attached, the capillary 12 follows a determined trajectory to the second point 5 whereby mainly two movement phases or trajectory sections, respectively, are to be distinguished (FIG. 2): The first movement phase s1 leads fundamentally from the chip 1 vertically upwards in order to pull the required wire length through the capillary 12 and the second phase s2 leads in an arc downwards to the contact finger 2b on the second connection point 5. Depending on the required geometry of the wire bridge, a preshaping of the wire takes place during the first phase s1 which also necessitates transient horizontal movements of the capillary. The almost finished wire bridge 3 presented as an example in FIG. 3 has, for example, a kink produced in a generally known way by means of pre-shaping during the first movement phase s1.

At a predetermined, programmed height H (in relation to the set height of the contact finger) an end section s3 of the capillary trajectory begins in which the capillary 12 with the emerging wire 3 is led from above to the point 5 on the substrate (contact finger 2b). The height of the contact finger is subject to a certain variation and is not precisely known at first; for the purposes of programming, a specific set value is assumed for the surface of the contact finger. The height H is determined so that the wire loop under the capillary does just not yet touch the contact finger 2b. This situation according to FIG. 2 is presented as a cut-out in a larger scale in FIG. 3 and the further course of movement of the capillary 12 in the end section s3 is shown in FIGS. 4 and 5.

Figure 3:
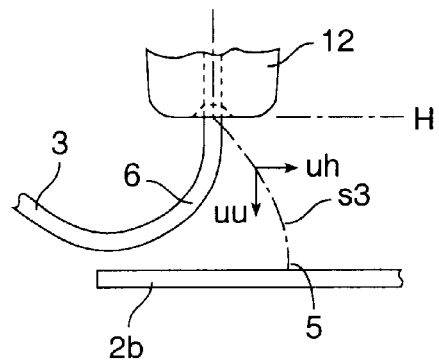
FIGS. 3, 4 and 5 show, in a further enlarged scale, the approach of the capillary to the second connection point in three successive phases.

When the underneath of the capillary 12 in accordance with FIG. 3 is located at height H, the wire emerges in an arc 6 which developed along the arc-shaped trajectory section s2 as the capillary moved down. The end section s3 of the capillary trajectory is now programmed in a special way, mainly for the purpose of avoiding undesired effects of the wire loop 6 on the shape of the wire bridge and on the bonding on the substrate. As presented in FIG. 3, the downward movement vv of the capillary starting from the height H is superimposed by a variable horizontal movement vh. This horizontal movement component vh is directed away from the first connection point 4 (FIG. 2) and decreases continuously in relation to the downward movement vv. As a result, therefore, the section s3 runs arc-shaped, at the start firstly obliquely to the substrate (with a tangent of, e.g, approx. 45°), then increasingly steeper to end ultimately approximately vertically, in any case at a steep angle at point 5 on the substrate. (Of course, on programming the end point of trajectory section s2 at height H, the amount of the horizontal movement vh is to be taken into consideration so that the trajectory ends at the specified location of point 5).

Figure 4:
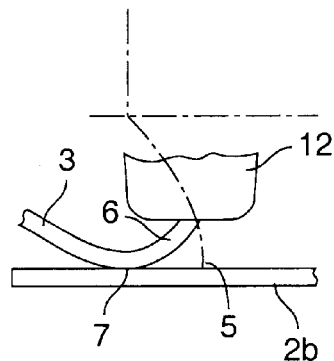
Figure 5:
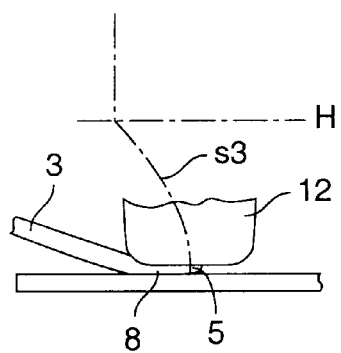

Starting from the position according to FIG. 3, the capillary 12 arrives at the section s3 in an intermediate position as presented in FIG. 4 after the lowest point of the wire loop 6 has touched the contact finger 2b at a point 7. As a result of the vertical and horizontal path followed by the capillary 12 up to now and its present, somewhat larger distance from point 4, the wire—when the wire bridge is taut—is slightly bent roughly as presented on emerging from the capillary and the arc 6 has become partially flattened. The further downward movement of the capillary, as can be seen in FIG. 4, is only superimposed by a reduced horizontal movement vh. The capillary movement along the curved trajectory section s3 looks approximatively or ideally like an "unrolling" or "unwinding" of the short piece of wire between the capillary and the point 7 whereby the wire on the capillary is bent increasingly but is neither pushed back into the capillary nor forward against the wire bridge.

Figure 6:
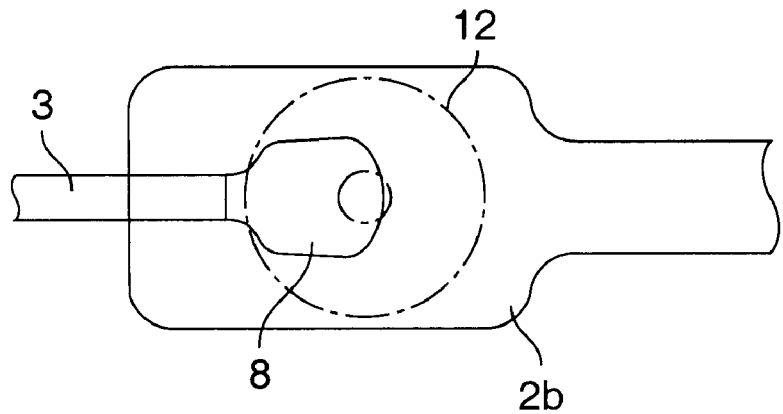
FIG. 6 is the plan view of the second connection point corresponding to FIG. 5 (drawn somewhat larger), with the shaped, attached wire end.

On further downward movement and—in relation to it—an almost or completely disappearing horizontal movement, the capillary (or the wire lying flat against its front, respectively) ultimately impacts on the substrate at a sharp angle in the area of point 5. The upwards directed force affecting the capillary increases significantly as is determined by means of the force sensor 19 (FIG. 1). For the control of the device 10 (FIG. 1), this means the termination of the programmed trajectory movement at the now determined effective height of the substrate and the capillary. Subsequently, the wire end is shaped in the known way under the metered force effect on the part of the motor 15, welded to the substrate by means of ultrasonic energy and finally detached. The final condition with the bonded piece of wire 8 shaped in the width by the capillary is shown in FIGS. 5 and 6.

With the described movement sequence in the trajectory section s3 regularly shaped wire bridges can be favourably achieved which are taut, i.e, are neither sagging nor bending outwards nor tending to bend outwards. The "laying down" of the wire bridges can, if necessary, be supported by the coordinated control of the above-mentioned (not presented) wire clamp above the capillary.

In addition to that it has been shown that a movement sequence of the type described above can also have favourable effects on bonding at the second connection point 5. Approaching the substrate as mentioned at a steep angle of around 90° means that the flattening of the end of the wire 8 as well as its welding to the connection point 5 under the face of the capillary takes place without lateral shifting of the capillary—somewhat in contrast to a diagonally running approach of the capillary the simultaneous lateral movement of which on pressing and welding can effect a wedge-shaped stretching and thinning and the imperfect welding of the end of the wire. The shaping and welding of the end of the wire 8 completely under the face of the capillary in accordance with FIGS. 5 and 6 on the other hand means that the shaping can be well controlled and the welded connection is accomplished extensively close to the not deformed wire. The correspondingly favourable circumstances could be determined in a series of experiments with which the force is measured which is necessary to pull the bonded wires off the substrate: Welded connections produced in the way described in connection with FIGS. 5 and 6 demonstrated significantly greater pull-off forces as those for the production of which the capillary made a simultaneous lateral shift.

Figure 7:
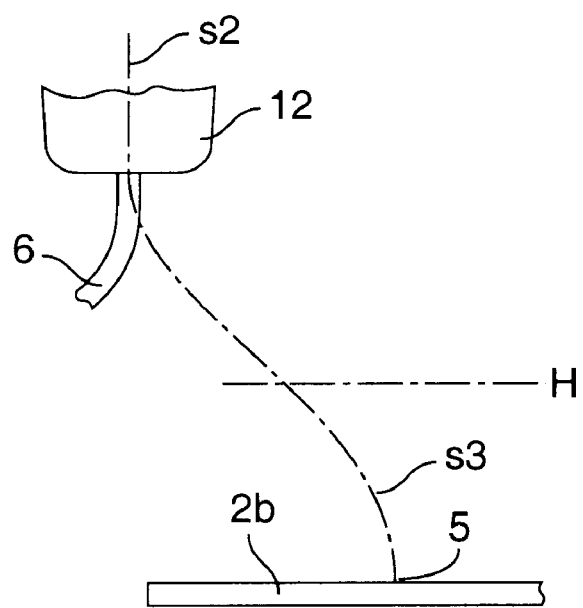
FIG. 7 illustrates a variation of the trajectory in the area of the transition to the end phase.

It can be an advantage, in contrast to the example of implementation in accordance with FIGS. 2 to 5 to arrange the transition from trajectory section s2 to end section s3 without a kink; an example of a corresponding programmed trajectory in the area of height H is presented in FIG. 7. With such a "running" transition for which the intended horizontal movement of the capillary 12 at the start of section s3 already begins above the height H, a certain shortening of the total cycle time can be achieved.

What is claimed is:

1. A Method for producing a wire connection between a first connection point located on a semiconductor chip and a second connection point located on a substrate or on a second semiconductor chip, said method comprising:

attaching a wire to the first connection point, running the wire through a horizontally and vertically moveable capillary which serves to attach the wire to the first and second connection points and to guide the wire between the first and second connection points, moving the capillary to the second connection point along a predetermined trajectory on which the wire is pulled out a required length and the wire is formed into a bridge, and moving the capillary to unroll a wire loop onto the substrate in an end section of the trajectory by superimposing on the end section a variable horizontal movement to a downward movement of the capillary, wherein said variable horizontal movement is directed away from the first connection point and continually decreases in relationship to the downward movement.

2. The method according to claim 1, with which the end section of the trajectory begins at a predetermined height above the substrate and at which the wire loop under the capillary does not yet touch or has only just touched the substrate or the second semiconductor chip.

3. The method according to claim 1, with which the end section of the capillary trajectory begins with a horizontal movement of the capillary substantially equivalent to the downward movement.

4. The method according to claim 1, with which the horizontal movement is almost reduced to zero towards the second connection point near the end section of the trajectory.

5. The method according to claim 2, with which the end section of the capillary trajectory begins with a horizontal movement of the capillary substantially equivalent to the downward movement.

6. The method according to claim 2, with which the horizontal movement is almost reduced to zero towards the second connection point near the end section of the trajectory.

7. The method according to claim 3, with which the horizontal movement (vh) is almost reduced to zero towards the second connection point near the end section of the trajectory.

8. The method according to claim 1, with which the horizontal movement is completely reduced to zero towards the second connection point near the end section of the trajectory.

9. The method according to claim 2, with which the horizontal movement is completely reduced to zero towards the second connection point near the end section of the trajectory.

10. The method according to claim 3, with which the horizontal movement is completely reduced to zero towards the second connection point near the end section of the trajectory.

* * * * *